United States Patent [19]

Usui et al.

[11] Patent Number: 5,328,541

[45] Date of Patent: Jul. 12, 1994

[54] METHOD OF WELDING TUBULAR PRODUCTS OF POLYARYLENE SULFIDE AND WELDED TUBULAR STRUCTURE

[75] Inventors: Satoshi Usui; Kouichi Kodama; Yoichiro Yamanobe; Ken Kashiwadate, all of Iwaki, Japan

[73] Assignee: Kureha Kagaku Kogyo Kabushiki Kaisha, Tokyo, Japan

[21] Appl. No.: 987,593

[22] Filed: Dec. 9, 1992

[30] Foreign Application Priority Data

Dec. 11, 1991 [JP] Japan .................... 3-350911
Oct. 13, 1992 [JP] Japan .................... 4-299131

[51] Int. Cl.$^5$ ............................... B32B 31/20
[52] U.S. Cl. ........................ 156/304.2; 156/304.6; 156/308.2; 156/309.9; 156/322; 264/209.8
[58] Field of Search ............. 156/304.2, 304.6, 309.9, 156/322, 308.2; 264/209.8

[56] References Cited

U.S. PATENT DOCUMENTS

| | | | |
|---|---|---|---|
| Re. 32,595 | 2/1988 | Davies | 156/308.2 |
| 3,013,925 | 12/1961 | Larsen | 156/304.6 |
| 4,405,740 | 9/1983 | Davies | 156/320 |
| 4,421,588 | 12/1983 | Davies | 156/308.2 |
| 4,764,235 | 8/1988 | Hazama et al. | 156/309.9 |
| 4,929,293 | 5/1990 | Osgar | 156/304.2 |

FOREIGN PATENT DOCUMENTS

| | | |
|---|---|---|
| 0167377 | 1/1986 | European Pat. Off. |
| 0167870 | 1/1986 | European Pat. Off. |
| 0312712 | 4/1989 | European Pat. Off. |
| 0440502 | 8/1991 | European Pat. Off. |
| WO90/00970 | 2/1990 | PCT Int'l Appl. |

Primary Examiner—Caleb Weston
Attorney, Agent, or Firm—Wenderoth, Lind & Ponack

[57] ABSTRACT

A pair of tubular products of polyarylene sulfide having end faces to be welded are welded to each other by heating the end faces by a hot plate in no contact with the end faces to a surface temperature which is at least the melting heat-absorption peak temperature and at most 80° C. above the melting initiation temperature of the polyarylene sulfide, and abutting the end faces under a pressure of 50–1500 kPa when the end faces are at a surface temperature which is at least 10° C. above the melting initiation temperature and not exceeding the melting heat-absorption peak temperature of the polyarylene sulfide. As a result, a welded tubular structure having a weld with a small inside bead but having a sufficiently large weld strength can be obtained with substantially no thermal degradation and at a good operating efficiency.

7 Claims, 2 Drawing Sheets

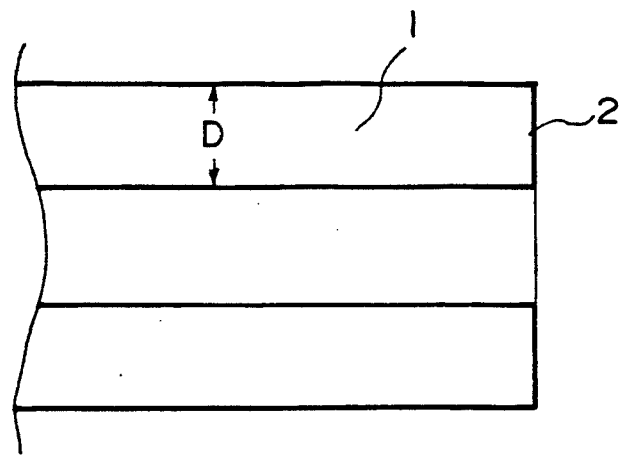
F I G. 1
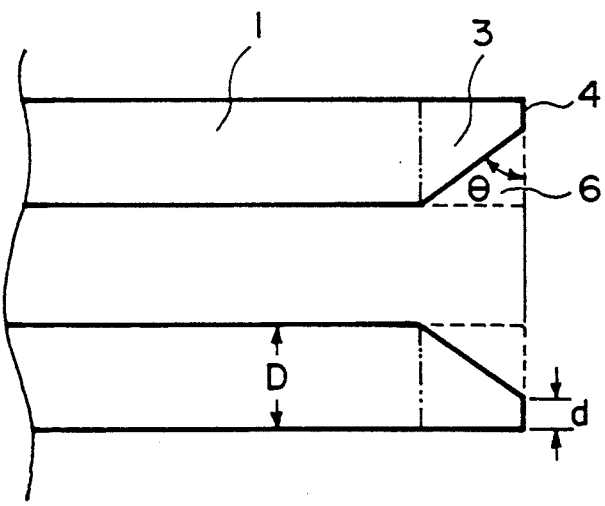
F I G. 2

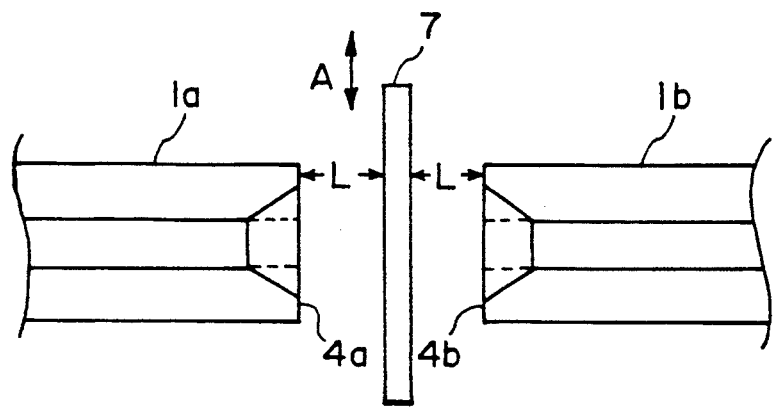
F I G. 3
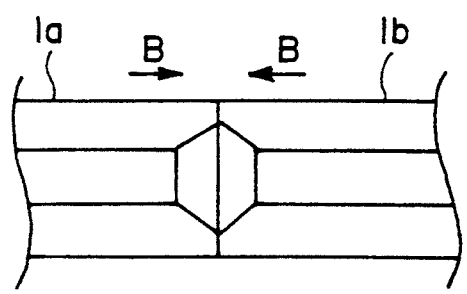
F I G. 4
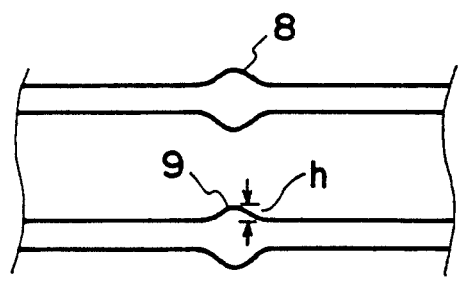
F I G. 5

METHOD OF WELDING TUBULAR PRODUCTS OF POLYARYLENE SULFIDE AND WELDED TUBULAR STRUCTURE

FIELD OF THE INVENTION AND RELATED ART

The present invention relates to a method of welding tubular products comprising polyarylene sulfide to provide a welded tubular structure with a small inside bead at the weld, with a relatively large weld strength and with little, if any, thermal degradation at a good operating efficiency, and also to a welded tubular structure thus obtained.

There have been developed several methods of welding tubular products of thermoplastic resins. Representative examples thereof may include a socket method wherein a pair of tubes shaped into a socket and an insert, respectively, are fitted to each other and then welded; and a method wherein a hot plate coated with a fluorine-containing resin, etc., is caused to contact faces to be welded to each other and the faces after being melted are bonded under pressure.

In any method, however, there is involved a problem that the resultant weld (i.e., welded part) is caused to have a shape different from the other parts. For example, in the socket method, it is impossible to avoid some gap or cavity between the welded faces which gap or cavity is liable to cause an increase of microbes or stagnation of minute particles, e.g., when the welded structure is used in contact with ultrapure water, and thus the welded structure is not suitable for such use. In the method using a hot plate, the weld is provided with a projecting seam generally called "bead" on the outside and inside thereof as a result of the bonding under pressure, and particularly the inside bead is liable to cause the increase of microbes or stagnation of minute particles similarly as the gap formed in the socket method. In the case of using a hot plate, it is also known to insert an inner support called "core" so as to prevent the occurrence of the inside bead. In this case, however, it is impossible to insert or withdraw a core having an identical size as the inner size of pipes to be welded. On the other hand, if a core having an outer size smaller than the inner size of the pipes is used so as to facilitate the insertion and withdrawal of the core, it is impossible to avoid the occurrence of a bead corresponding to the gap between the inner size of the pipes and the core, thus resulting in an inside bead in excess of 1 mm. Further, in the case of welding fittings such as elbows or tees, it is very difficult to insert and withdraw a core, thus resulting in a poor operating efficiency.

There is disclosed a method of welding pipes of heat-fusible fluorine-containing resin without causing an inside bead in Japanese Laid-Open Patent Application No. 62-279925. In the method, a pair of pipes each having an end having a decreasing taper from the outside surface to the inside surface so as to avoid thermal degradation are welded to each other while heating the ends by hot air. If this method is applied to welding of pipes of polyarylene sulfide, however, it is inevitable to cause thermal degradation due to oxidation of the sulfide part during heating with hot air in spite of generally excellent heat resistance of polyarylene sulfide, thus resulting in discoloration into brown of the weld.

There is another difficulty in butt welding of polyarylene sulfide pipes that a higher weld strength can be obtained at a higher abutting pressure, which however inevitably results in a larger bead. Accordingly, it has been difficult to produce a weld having a small bead but retaining a relatively large weld strength.

SUMMARY OF THE INVENTION

An object of the present invention is to provide a welding method whereby tubular products of polyarylene sulfide can be welded to provide a weld having a small, if any, bead but showing a relatively high weld strength with little thermal degradation and at a good operating efficiency, and also a welded tubular structure thus obtained.

According to the present invention, there is provided a method of welding tubular products of polyarylene sulfide, comprising the steps of:

providing a pair of tubular products of polyarylene sulfide having end faces to be welded to each other, the polyarylene sulfide showing a melting initiation temperature and a melting heat-absorption peak temperature, heating the end faces by a hot plate in no contact with the end faces, and abutting the end faces under pressure when the end faces are at a surface temperature which is at least 10° C. above the melting initiation temperature and is not exceeding the melting heat-absorption peak temperature, respectively, of the polyarylene sulfide, thereby forming a weld. In this instance, it is preferred to include a sequence of heating the end faces to be welded to each other to a surface temperature which is at least the melting heat-absorption peak temperature and at most 80° C. above the melting heat-absorption peak temperature respectively of the polyarylene sulfide, moving the hot plate away from the end faces and then abutting the end faces to each other at a pressure of about 50 to 1500 kPa (0.5-15 kg/cm$^2$).

According to another aspect of the present invention, there is provided a welded tubular structure, comprising a pair of tubular products of polyarylene sulfide welded to each other with a weld which is substantially free from discoloration, has an inside bead, if any, of at most 1 mm in height, and has a tensile strength of at least 50% that of the tubular product per se.

In the present invention, the end faces of tubular products of polyarylene sulfide to be welded are heated by a hot plate free of contact with the end faces. In this case, unlike the heating with hot air in the above-mentioned prior art method, air surrounding the hot plate is cold, and the temperature is not excessively increased only by radiation heat, so that the polyarylene sulfide is not readily oxidized to cause thermal degradation. Further, by heating the end faces into a molten state and welding the end faces in a specific temperature range, whereby a weld having a small inside bead but showing a high weld strength factor can be formed. Herein, the term "weld strength factor" refers to a ratio in percentage of the tensile strength of a weld to that of another part (i.e., tensile strength of the tubular product per se) respectively cut out from a welded tubular structure into dumbbell-shaped specimens.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a sectional view of an embodiment of an end portion to be welded of a tubular product which has not been provided with an inside taper.

FIG. 2 is a sectional view of an embodiment of an end portion to be welded of a tubular product which has been provided with an inside taper.

FIG. 3 is an illustration of a manner of heating a pair of end faces of tubular products to be welded by a hot plate.

FIG. 4 is an illustration of a manner of abutting the pair of end faces after the heating.

FIG. 5 is a partial sectional view of an embodiment of the welded tubular structure.

DETAILED DESCRIPTION OF THE INVENTION

Herein, the term "polyarylene sulfide" refers to a polymer comprising a recurring unit represented by —Ar—S— as a principal constituent, wherein —Ar— denotes an arylene group in a broad sense including p-phenylene, m-phenylene, naphthylene, and divalent aromatic residue groups containing at least two aromatic rings of 6 carbon atoms, such as —Ph—Co—Ph— (wherein "—Ph—" denotes a phenylene group similarly as hereinbelow), —Ph—O—Ph—, —Ph—CH$_2$—Ph—, and —Ph—SO$_2$—Ph—. Each aromatic ring can further contain a substituent such as an alkyl group or a carboxyl group. The polyarylene sulfide may be in the form of a homopolymer, a random copolymer or a block copolymer.

The polyarylene sulfide may preferably be one comprising a phenylene sulfide group, particularly a paraphenylene sulfide group, as a principal constituent. Herein, the term "principal constituent" means that, when "—Ar—S—" is taken as a unit mol, the constituent concerned occupies at least 50 unit mol. %, preferably at least 70 unit mol. %, more preferably at least 90 unit mol. %. The polyarylene sulfide may preferably be a substantially linear polymer comprising a bifunctional monomer as a principal constituent and capable of including a tri- or higher-functional group as a minor constituent. The polyarylene sulfide may have a molecular weight sufficiently high to provide a required mechanical strength.

Herein, the tubular product of polyarylene sulfide may include of a product composed of polyarylene sulfide alone and also a product composed of a composition comprising polyarylene sulfide and another ingredient, such as an impact resistance modifier, reinforcing fiber, or an inorganic filler. The tubular product may include products having a tubular portion, inclusive of pipes, joints, and valves. Such tubular products may be formed through ordinary molding or forming methods, such as extrusion and injection.

The sectional shape of the tubular product may be a circle in many cases but can be an oval having a long-axis/short-axis ratio of about 1.2 or smaller, or another profile shape inclusive of a polygon. According to the present invention, such tubular products having a diameter (calculated as a circle having an equivalent sectional area) of e.g., 10–250, mm and a thickness of, e.g., 1–10 mm, may conveniently be welded.

Each end of tubular products to be welded can be provided with an inside taper or cut so as to further decrease the inside bead. FIG. 1 is a sectional view of an embodiment of an end portion to be welded of a tubular product (pipe) which is not provided with such an inside taper to leave a rightangle end face 2 having a width or thickness identical to the pipe thickness D. FIG. 2 is a sectional view of an embodiment of an end portion to be welded of a tubular product (pipe) which has been provided with an inside cut 6 to leave a tapered portion 3 having a narrowed end face 4 having a narrow width d smaller than the pipe thickness D, and forming an inside taper angle $\theta$ with respect to the end face 4. Referring to FIG. 2, the end portion 3 to be welded of the tubular product 1 is provided with an inside cut 6 along the entire length of its inner peripheral edge.

It is preferred that the inside cut 6 is formed in a volume which is not larger than but at least 1/20 of the volume of the remaining tapered portion 3. The end face 4 left after forming the inside cut 6 can have only its outer periphery (having a thickness or width of substantially zero) in an extreme case but may preferably have a certain thickness or width.

More specifically, the end face 4 to be welded left after forming the inside cut 6 may preferably have a width d which is at least $\frac{1}{3}$, more preferably at least 2/5, of the pipe thickness D. The inside taper angle $\theta$ may be in the range of 10–70 degrees, preferably 20–70 degrees, particularly preferably 30–45 degrees. The end face 4 after the inside cutting should desirably be cleaned to remove cutting residue and be finished for subsequent welding.

According to the present invention, a pair of end faces to be welded of such tubular products are heated by a hot plate free of contact with the end faces. More specifically, as shown in FIG. 3 corresponding the embodiment of FIG. 2, end faces 4a and 4b to be welded to each other of a pair of tubular products 1a and 1b are separated from each other and are heated by a hot plate 7 disposed at the midway between the end faces 4a and 4b and having two major surfaces each constituting a heating surface. Incidentally, it is of course possible to use two hot plates having similar surface temperatures instead of a single hot plate having two heating surfaces as described above in order to heat the pair of end faces to be welded to each other. It is preferred that the end faces are heated to a surface temperature which is at least the melting heat-absorption peak temperature and at most 80° C. above the melting heat-absorption peak temperature of the polyarylene sulfide. If the temperature is more than 80° C. above the melting heatabsorption peak temperature, thermal degradation of the polyarylene sulfide is liable to be caused. Herein, the melting heat-absorption peak temperature refers to a melting heat-absorption peak temperature of a sample polyarylene sulfide when the sample is heated at a temperature-increasing rate of 10° C./min in a differential scanning calorimeter (DSC) ("DSC-30" available from Mettler Instrumente A.G.).

The hot plate 7 may be a known one inclusive of a metal heater equipped with a rod heater embedded therewithin, a ceramic heater, a cast heater, etc. The distance L between the hot plate 7 and the respective end faces 4a, 4b of the tubular products 1a, 1b to be welded to each other may ordinarily be several mm or shorter, more specifically at most 3 mm, preferably at most 2 mm, further preferably at most 1 mm, while it can be different to some extent depending on other factors, such as the type of the hot plate, the temperature of the hot plate, and the heating time. The heating time is not particularly limited since it depends on the temperature of the hot plate, but may ordinarily be 3 min. or shorter, preferably be 2 min or shorter.

Then, the hot plate 7 is moved away from the end faces 4a and 4b to be welded to each other ordinarily in a direction parallel to the end faces, e.g., vertically in directions denoted by a two-headed arrow A or horizontally. Thereafter, the tubular products are caused to approach each other in directions of arrows B so that the end faces 4a and 4b are abutted to each other as shown in FIG. 4 while the end faces are at a prescribed temperature giving a molten state of polyarylene sulfide. More specifically, the temperature at the time of the abutment, i.e., welding is at least 10° C. above the melting initiation temperature and is not exceeding the melting heat-absorption peak temperature, respectively, of polyarylene sulfide. The temperature is preferably at least 15° C. above the melting initiation temperature and is at least 2° C. below the melting heat-absorption peak temperature. Herein, the melting initiation temperature refers to a temperature at which a heat absorption curve begins to rise due to melting of a sample polyarylene sulfide on a DSC curve when measured by a differential scanning calorimeter ("DSC-30" available from Mettler Instrumente A.G.) at a temperature-raising rate of 10° C./min.

The welding is effected under the action of an abutting pressure which may ordinarily be about 50 -1500 kPa (0.5-15 kg/cm$^2$), preferably about 70-1200 kPa (0.7-12 kg/cm$^2$), more preferably about 100 -500 kPa (1-5 kg/cm$^2$) when calculated as a pressure acting on the area given by the original thickness D of the pipes 1a and 1b. If the pressure is below 50 kPa, it is difficult to obtain a sufficient weld strength, and a pressure exceeding 1500 kPa is liable to provide an excessively large inside bead. By performing the welding within the above-described pressure range, it is possible to form a weld showing a tensile strength which is at least 50 %, preferably at least 80% under appropriately selected conditions, of that of the tubular product 1a or 1b per se and forming only a small bead. Particularly, in the case where an inside cut 6 is formed as has been described with reference to FIGS. 2 and 3, the end faces 4a and 4b are welded to each other in such a manner that most of the remaining tapered portions 3 fills the inside cut 6 under the abutting pressure and a part thereof is projected outside the resultant welded tubular structure to form an outside bead 8, whereby it is possible to provide a weld forming an inside bead 9 which shows an even smaller height h, if any, but showing a sufficiently large weld strength factor. An outside unevenness formed by such an outside bead 8 does not adversely affect the essential function of the welded tubular structure. On the other hand, the height h of the inside bead 9 which can cause undesirable soiling or stagnation within the tubular structure, is suppressed to at most 1 mm according to the present invention. Further, the resultant weld is substantially free from discoloration, i.e., free from discoloration into brown as readily observable by eyes in the case of welding by using hot air for the heating.

Hereinbelow, the present invention will be described more specifically with reference to Examples and Comparative Example. [Testing Method The tensile strengths referred to herein are based on values measured according to JIS-K6724 except for a modification that tubular samples were composed of polyphenylene sulfide instead of vinyl chloride resin as specified. For convenience, the original thickness of a tubular product is used for calculation of the sectional area of a welded part as a basis for calculation of the tensile strength per unit area of the welded part. The end face temperature and the hot plate surface temperature are values measured by using a thermocouple ("MOBAC 220", available from Nireco K.K.) and a contact-type surface temperature meter ("Pocket Thermometer-Model 2542", available from Yokogawa Denki K. K.), respectively. For accuracy, the end face temperature was measured with respect to sample tubular products which were heated under the same conditions as sample tubular products that were actually subjected to welding after the heating.

EXAMPLE B 1

Polyphenylene sulfide (having a melt viscosity of about 2.8 kPa.sec (28000 Poises) at 310 ° C. and a shear rate of 200/sec; a melting initiation temperature of 220° C.; and a melting heat-absorption peak temperature of 277° C.) was formed into pellets by a single-screw pelletizer. The pellets were dried for 3 hours at 140° C. to remove water and volatile matter. The resin temperature was 330° C. at the die entrance and about 310° C. at the die outlet.

The pellets fed into and extruded through a small-size single screw extruder (inner dia.: 35 mm) equipped with an outside mandrel at the die and having a cylinder temperature set to 250°-330 ° C. The extrusion was performed at a screw rotational speed giving an angular velocity of $\pi/2$ rad.sec$^1$ (15 rpm), followed by stretching at 3% radially for sizing and cooling with water to prepare a pipe, which was found to have an inside diameter of 26 mm and a thickness of mm and have a smooth inside surface.

Two pipes thus prepared were subjected to edge preparation to form an inside cut thickness (D—d) of 1 mm and an inside taper-angle ($\theta$) of 30 degrees. The two end faces each provided with an inside taper thus formed were disposed opposite to each other with a spacing therebetween, and a ceramic heater having two surfaces each at a surface temperature of 450° C. so that a spacing L of 1 mm was left from the respective end faces. The end faces were thus heated for 35 sec to 284° C. (maximum heating temperature). Then, the heater was removed, and then the end faces of the pipes were abutted to each other at an abutting pressure of 1100 kPa (11.0 kg/cm$^2$) when the end faces were at 268° C. (welding temperature).

The resultant welded tubular structure (pipe) was provided with a weld which showed an inside bead height (h) of 0.9 mm and was free from discoloration, thus showing no trace of thermal degradation. Two types of dumbbell specimens were cut out from the welded pipe, one from a part including the weld and the other from another part. The weld showed a tensile strength of 52 MN/m$^2$ (5.3 kg/mm$^2$) and the other specimen showed a tensile strength of 62 MN/m$^2$ (6.3 kg/mm$^2$) as that of the original pipe per se. As a result, the welded structure showed a weld strength factor of 84%.

The following Table 1 summarizes representative conditions and results together with those of other Examples and Comparative Example which will be described hereinafter.

TABLE 1

| | Inside taper | | Max. heating temp. (°C.) | Welding temp. (°C.) | Inside bead height (mm) |
|---|---|---|---|---|---|
| | Angle (deg.) | Cut thickness (mm) | | | |
| Ex. 1 | 30 | 1 | 284 | 268 | 0.9 |
| 2 | 45 | 1 | 284 | 268 | 0.45 |
| 3 | 45 | 0.5 | 292 | 272 | 0.9 |
| Comp. Ex. | 45 | 0.5 | 304 | 285 | 1.2 |

EXAMPLE 2

Two pipes of polyphenylene sulfide prepared in the same manner as in Example 1 was subjected to edge preparation so as to form an inside cut thickness of 1 mm and an inside taper angle of 45 degrees. The two pipes thus treated were then welded to each other in the same manner as in Example 1. The resultant welded structure was provided with a weld, which showed an inside bead height of 0.45 mm and was free from discoloration, thus showing no trace of thermal degradation. The weld further showed a tensile strength of 49.3 MN/m$^2$ (5.0 kg/mm$^2$) corresponding to a weld strength factor of 80%.

EXAMPLE 3

Two pipes were prepared, subjected to edge preparation and welded to each other in a similar manner as in Example 1 except that the inside taper angle was 45 degrees, the inside cut thickness was 0.5 mm and the end faces were heated for 40 sec. The resultant welded structure was provided with a weld, which showed an inside bead height of 0.9 mm and was free from discoloration, thus showing no trace of thermal degradation. The weld showed a tensile strength of 52 MN/m$^2$ (5.3 kg/mm$^2$) corresponding to a weld strength factor of 84%.

COMPARATIVE EXAMPLE

Two pipes were prepared, subjected to edge preparation and welded to each other in a similar manner as in Example 1 except that the inside taper angle was 45 degrees, the inside cut thickness was 0.5 mm and the end faces were heated for 50 sec. The welding temperature was 285° C. as a result. The resultant welded structure was provided with a weld, which was free from discoloration, thus showing no trace of thermal degradation. The weld showed a tensile strength of 62 MN/m$^2$ (6.3 kg/mm$^2$) corresponding to a weld strength factor of 100%. However, the inside bead height was increased to 1.2 mm.

As described above, according to the present invention, it has become possible to provide a welded tubular structure with a weld which is free from discoloration due to thermal oxidative degradation, has an inside bead giving a height, if any, of at most 1 mm, and yet shows a weld strength factor of at least 50%. The welding method is easy in operation and is easily applicable to welding of fittings, such as elbows or tees. As a result, it is possible to provide a welded tubular structure which is particularly suitable as a pipe for transporting ultra-pure water.

What is claimed is:

1. A method of welding tubular products of polyarylene sulfide, comprising the steps of:
   providing a pair of tubular products of polyarylene sulfide having end faces to be welded to each other, the polyarylene sulfide showing a melting initiation temperature and a melting heat-absorption peak temperature,
   heating the end faces by a hot plate in no contact with the end faces, and
   abutting the end faces under pressure when the end faces are at a surface temperature for abutting which is at least 10° C. above the melting initiation temperature and is not exceeding the melting heat-absorption peak temperature, respectively, of the polyarylene sulfide, thereby forming a weld.

2. A method according to claim 1, wherein the end faces are heated to a surface temperature which is at least the melting heat-absorption peak temperature and at most 80° C. above the melting heat-absorption peak temperature, respectively, of the polyarylene sulfide, the hot plates is then moved away from the end faces, thereby to allow the end faces to cool to the surface temperature for abutting, and then the end faces are abutted to each other at a pressure of about 50 to 1500 kPa (0.5–15 kg/cm$^2$).

3. A method according to claim 1, wherein each end of the tubular products to be welded is provided with an inside taper by cutting inside edge and then subjected to the heating and abutting.

4. A method according to claim 1, wherein each end of the tubular products to be welded is provided with an inside taper by cutting inside edge to leave an end face having a thickness of at least ⅓ of that of the tubular product per se, and the inside taper shows an inside taper angle of 10–70 degrees with respect to the end face.

5. A method according to claim 4, wherein the inside taper angle is 20–60 degrees.

6. A method according to claim 1, wherein the end faces are abutted under pressure when the end faces are at a surface temperature which is at least 15° C. above the melting initiation temperature and is at least 2° C. below the melting heat-absorption peak temperature, respectively, of the polyarylene sulfide.

7. A method according to claim 2, wherein the end faces are abutted to each other at a pressure of about 70 to 1200 kPa (0.7–12 kg/cm$^2$).

* * * * *